United States Patent
Yoshida et al.

(10) Patent No.: US 6,545,279 B1
(45) Date of Patent: Apr. 8, 2003

(54) SURFACE STATE MONITORING METHOD AND APPARATUS

(75) Inventors: Haruo Yoshida, Tokyo (JP); Michiaki Endo, Tokyo (JP)

(73) Assignee: Adramtest Corp., Tokyo (JP)

( * ) Notice: Subject to any disclaimer, the term of this patent is extended or adjusted under 35 U.S.C. 154(b) by 0 days.

(21) Appl. No.: 09/716,863

(22) Filed: Nov. 18, 2000

(30) Foreign Application Priority Data

Jan. 6, 2000 (JP) .................................. 2000-000964

(51) Int. Cl.[7] .............................................. G01N 21/00
(52) U.S. Cl. .................................................. 250/341.4
(58) Field of Search ........................... 250/341.4, 341.8, 250/559.36

(56) References Cited

U.S. PATENT DOCUMENTS

| | | | | |
|---|---|---|---|---|
| 4,825,093 A | * | 4/1989 | Kiriseko et al. | 250/566 |
| 5,386,121 A | * | 1/1995 | Barbee et al. | 250/341.8 |
| 5,504,345 A | * | 4/1996 | Bartunek et al. | 250/559.36 |
| 6,091,499 A | * | 7/2000 | Abraham et al. | 356/623 |
| 6,320,609 B1 | * | 11/2001 | Buchanan et al. | 348/126 |

* cited by examiner

*Primary Examiner*—Constantine Hannaher
*Assistant Examiner*—Shun Lee
(74) *Attorney, Agent, or Firm*—Muramatsu & Associates

(57) ABSTRACT

A surface state monitoring apparatus for monitoring a surface state of semiconductor substrates by infrared spectroscopy at fabrication site of semiconductor substrates. The apparatus comprises an incidence optical system for introducing infrared radiation into a substrate-to-be-monitored, a detection optical system for detecting infrared radiation which has undergone multiple reflections inside the substrate and exited from the substrate, a surface state monitoring means for monitoring a surface state of the substrate based on the detected infrared radiation, a position detecting means for optically detecting a position of the substrate, and a control means for controlling a position and an angle at which infrared radiation to be incident on the substrate, corresponding to the position of the substrate.

19 Claims, 12 Drawing Sheets

| POINT | x | y |
|---|---|---|
| A | 75 μm | 0 μm |
| B | 500 μm | 0 μm |
| C | 50 μm | 258 μm |
| D | 0 μm | 75 μm |

SURFACE STATE MONITORING METHOD AND APPARATUS

BACKGROUND OF THE INVENTION

The present invention relates to a surface state monitoring method and apparatus for performing in-situ monitoring of surface states of semiconductor substrates by infrared spectroscopy at fabrication site of semiconductor devices.

Various requirements at fabrication sites of semiconductor devices require surface states of the semiconductor substrates being accurately grasped.

To give an example, in the field of semiconductor integrated circuits of memory devices, such as DRAM (Dynamic Random Access Memory), etc., and of logic devices, to form a gate insulation film having dielectric breakdown voltage of a required value, it is very important that surface states of a semiconductor substrate are administered. As a device has higher integration, the gate insulation film at the time of the fabrication of the device is made thinner, and the device has a design that the function for insulating an electric field (about $4 \times 10^6$ V/cm) of a MOS (Metal Oxide Semiconductor) FET (Field Effect Transistor) in operation has a small margin. Generally, a gate insulation film is formed by thermal oxidation. In forming a gate insulation film by thermal oxidation, in a case of surface contamination, as of metal contamination, chemical contamination, organic contamination or others is present, there is a risk that dielectric breakdown of the formed gate insulation film may be induced. It is known that organic contaminants stayed on the substrate surfaces after the gate insulation film has been formed results in insulation deterioration.

Plasma etching is widely used in steps of patterning device structures. In the plasma etching process, to set optimum plasma etching conditions and to detect the end point of the plasma etching, it is very effective to know adsorption states, chemical bonding states, structures and thicknesses of reaction layers, etc. of surface states of semiconductor wafers. The plasma etching process is determined by dynamic balance in adsorption, reaction and elimination processes between influxes of radical ions, etc. fed in gas phase and outfluxes from semiconductor wafer surfaces.

Recently, semiconductor devices have elements increasingly micronized, and are made increasingly three dimensional. This makes it difficult for cleaning solutions to intrude into micronized regions or steep steps or to be replaced there. In consideration of future further micronization, dry cleaning is noted. For example, to remove organic contaminants staying on semiconductor wafers reaction with ozone or oxygen excited by UV radiation is effective. Oxygen molecules are dissolved to oxygen atoms by light of a below 242 nm wavelength. The organic contaminants are oxidized by the oxygen atoms and solved into $H_2O$, $O_2$, CO, $CO_2$, etc. of high vapor pressures. Organic bonds, such as C—C, C—H, C—O, etc. can be dissolved by UV radiation. Thus, knowing surface states of semiconductor wafers is very important also to control parameters for the dry cleaning, such as an optimum amount of radiation, wavelength, oxygen amount, etc.

Native oxide films formed on the surfaces of semiconductor wafers are not usable in devices because their thickness cannot be controlled. Accordingly, it is preferable that when a device is fabricated on a semiconductor wafer, native oxide film on the silicon substrate is removed, and silicon bonds on the surfaces are terminated with hydrogen to stabilize the surfaces of the semiconductor wafer. This is because hydrogen can be eliminated at a relatively low temperature of about 500° C., and the termination with hydrogen relatively little affects the following processes. Most of silicon atoms on the surfaces of a semiconductor wafer subjected to UV ozone cleaning and hydrogen fluoride etching are terminated with hydrogen, and Si=$H_2$ and Si—H are formed. Accordingly, if a state of the termination with hydrogen on semiconductor wafer surfaces, temperature dependency of the elimination of terminating hydrogen can be monitored, the semiconductor wafer surfaces at the start of semiconductor processing can be kept in a suitable state. Higher quality and higher yields can be expected.

Thus, it is very important to know a surface state of a semiconductor wafer in a fabrication process of a semiconductor device, and various monitoring methods and apparatuses have been proposed and locally practiced.

Means for monitoring a surface state of a semiconductor wafer by internal multiple reflection of infrared radiation is provided by, e.g., FT-IR (Fourier Transform-Infrared spectroscopy) apparatus of the special use marketed by Perkin-Elmer Co., U.S.A. For wider applications of the means Graseby Specac Limited, for example, markets various accessories.

In the conventional surface state monitoring method using this means, as exemplified in FIG. 12A, a substrate-to-be-monitored 102 is cut into, e.g., a 40 mm×10 mm strip, and infrared radiation emitted from an infrared radiation source 104 is passed through the substrate-to-be-monitored 102 to monitor states of the substrate surfaces. Otherwise, as exemplified in FIG. 12B, a substrate-to-be-monitored 102 has the end tapered, and infrared radiation is incident on the end surface of the substrate-to-be-monitored 102 to undergo multiple reflection inside the substrate, whereby a surface state of the substrate is monitored. Otherwise, as exemplified in FIG. 12C, infrared radiation is incident on a substrate-to-be-monitored via a prism 106 positioned above the substrate to undergo multiple reflection inside the substrate, whereby a surface state of the substrate is monitored.

The basic principle of monitoring a surface state of a substrate by applying infrared radiation to a substrate to cause the infrared radiation to undergo multiple reflection inside the substrate is that spectra of frequency components of evanescent waves oozing when light reflects on the substrate surfaces are resonance-absorbed when they agree with molecular vibrational frequencies of organic contaminants on the substrate surfaces are measured, whereby kinds and amounts of the organic contaminants can be determined. The basic principle also has a function that information of organic contaminants on substrate surfaces is gradually made more exact. A signal vs. noise ratio (S/N ratio) is also improved.

However, these monitoring methods needs cutting a substrate-to-be-monitored into strips, additionally machining a substrate-to-be-monitored, or disposing a prism above a substrate-to-be-monitored. These monitoring methods have not been usable in the in-situ monitoring at site of fabricating semiconductor devices.

Methods of monitoring organic contaminants on semiconductor substrates are known thermal desorption GC/MS (Gas Chromatography/Mass Spectroscopy), APIMS (Atmospheric Pressure Ionization Mass Spectroscopy), TDS (Thermal Desorption Spectroscopy), etc. However, these methods are not suitable to be used in in-situ monitoring at site of fabricating semiconductors for reasons that these methods cannot directly observe large wafers of, e.g., above 300 mm-diameters which are expected to be developed, and need vacuum ambient atmosphere, and have a low throughput, and other reasons.

As described above, the above-described conventional surface state monitoring methods are not usable in the in-situ monitoring at site of fabricating semiconductor devices because the monitoring by these method is destructive, or these methods are not suitable for monitoring large semiconductor wafers. Surface state monitoring methods and apparatuses which permit the in-situ monitoring of substrate surfaces at site of fabricating semiconductor devices, and permit large wafers to be monitored have been expected.

SUMMARY OF THE INVENTION

An object of the present invention is to provide a surface monitoring method and apparatus which enable, at the site of fabricating a semiconductor device, in-situ monitoring of surface states of a substrate-to-be-monitored by infrared radiation spectroscopy of internal multiple reflection.

The above-described object is achieved by a surface state monitoring apparatus comprising: an incidence optical system for introducing infrared radiation into a substrate-to-be-monitored; a detection optical system for detecting the infrared radiation undergoing multiple reflections inside the substrate-to-be-monitored and exiting from the substrate-to-be-monitored; a surface state monitoring means for monitoring a surface state of a surface of the substrate-to-be-monitored, based on infrared radiation detected by the detection optical system; a position detecting means for optically detecting a position of the wafer-to-be-monitored; and a control means for controlling a position and an angle at which the infrared radiation is incident on the substrate-to-be-monitored, corresponding to the position of the substrate-to-be-monitored detected by the position detecting means. A positional deflection of a substrate-to-be-monitored is detected, and a position and an angle of the infrared radiation source can be quickly adjusted, corresponding to the positional deflection of the substrate-to-be-monitored, whereby infrared radiation can be incident on the declined face of the substrate-to-be-monitored at a suitable position and at a suitable angle without affecting throughput of all steps as a whole, and an internal reflection angle can be controlled to be a suitable angle. Accordingly, a time of total reflections inside the substrate-to-be-monitored can be suitably controlled, and accordingly a surface state of the substrate-to-be-monitored can be monitored with higher accuracy.

In the above-described surface state monitoring apparatus, it is preferable that the control means controls the incidence optical system to thereby control a position and an angle at which infrared radiation is incident on the substrate-to-be-monitored.

In the above-described surface state monitoring apparatus, it is preferable that the control means controls the wafer mount to adjust a position of the substrate-to-be-monitored to thereby control a position and an angle at which infrared radiation is incident on the substrate-to-be-monitored.

In the above-described surface state monitoring apparatus, it is preferable that the position detecting means is disposed above a peripheral edge of the substrate-to-be-monitored, and includes a first radiation source for applying first radiation to a peripheral edge of the substrate-to-be-monitored and a first photo detector disposed opposed to the first radiation source across the peripheral edge of the substrate-to-be-monitored, for detecting the first radiation; and the position detecting means detects a position of the substrate-to-be-monitored in the horizontal direction, based on a position of radiation detected by the first photo detector.

In the above-described surface state monitoring apparatus, it is preferable that the position detecting means includes a second radiation source for applying second radiation to the peripheral edge of the substrate-to-be-monitored and a second photo detector for detecting the second radiation reflected by the peripheral edge; and the position detecting means detects a vertical position of the substrate-to-be-monitored, based on a position of radiation detected by the second photo detector.

In the above-described surface state monitoring apparatus, it is preferable that the first radiation source and/or the second radiation source applies the first radiation and/or the second radiation to a region containing a position for infrared radiation to be incident on the substrate-to-be-monitored.

In the above-described surface state monitoring apparatus, it is preferable that the first radiation source and/or the second radiation source traverses the first radiation and/or the second radiation around a position for infrared radiation to be incident on the substrate-to-be-monitored.

In the above-described surface state monitoring apparatus, it is preferable that the position detecting means optically detects a position of the substrate-to-be-monitored at a plurality of positions along the peripheral edge of the substrate-to-be-monitored.

In the above-described surface state monitoring apparatus, it is preferable that the first radiation and/or the second radiation is radiation having a wavelength different from the wavelengths of infrared radiation.

In the above-described surface state monitoring apparatus, it is preferable that the first photo detector and/or the second photo detector one-dimensionally or two-dimensionally detects a position of the substrate-to-be-monitored.

The above-described object is achieved by a surface state monitoring method for monitoring a surface state of a substrate-to-be-monitored by introducing infrared radiation into the substrate-to-be-monitored, detecting infrared radiation which has undergone multiple reflections inside the substrate-to-be-monitored and exited from the substrate-to-be-monitored, and analyzing the detected infrared radiation, a position of the substrate-to-be-monitored being optically detected, and a position and an angle at which infrared radiation is incident on the substrate-to-be-monitored being controlled corresponding to the detected position of the substrate-to-be-monitored.. A positional deflection of a substrate-to-be-monitored is detected, and a position and an angle of the infrared radiation source can be quickly adjusted, corresponding to the positional deflection of the substrate-to-be-monitored, whereby infrared radiation can be incident on the declined face of the substrate-to-be-monitored at a suitable position and at a suitable angle without affecting throughput of all steps as a whole, and an internal reflection angle can be controlled to be a suitable angle. Accordingly, a time of total reflections inside the substrate-to-be-monitored can be suitably controlled,. and accordingly a surface state of the substrate-to-be-monitored can be monitored with higher accuracy.

In the above-described surface state monitoring method, it is preferable that when the monitor is repeated a plurality of times with the substrate-to-be-monitored rotated to monitor a surface of the substrate-to-be-monitored substantially all over the surface, prior to the monitor for each time, a position of the substrate-to-be-monitored is optically detected, and a position and an angle of infrared radiation to be incident on the substrate-to-be-monitored are controlled corresponding to the detected position of the substrate-to-be-monitored.

As described above, according to the present invention, a positional deflection of a semiconductor wafer is detected, a position and an angle of the infrared radiation source can be quickly adjusted, corresponding to the positional deflection of the semiconductor wafer. Accordingly, according to the present invention, infrared radiation can be incident on the declined face of a semiconductor wafer at a suitable position and at a suitable angle, whereby an internal reflection angle can be suitably controlled. Accordingly, according to the present invention, a number of times of total reflections inside a semiconductor wafer can be suitably controlled, whereby surface states of the semiconductor wafer can be monitored with high accuracy.

Furthermore, according to the present invention, a position and an angle of the infrared radiation source can be quickly adjusted, corresponding to a positional deflection of a semiconductor wafer, whereby even in a case that a semiconductor wafer is rotated to monitor substantially all the surfaces thereof for organic contamination and chemical contamination, throughput of all steps as a whole are kept from being affected.

DETAILED DESCRIPTION OF THE INVENTION

Figure 1:
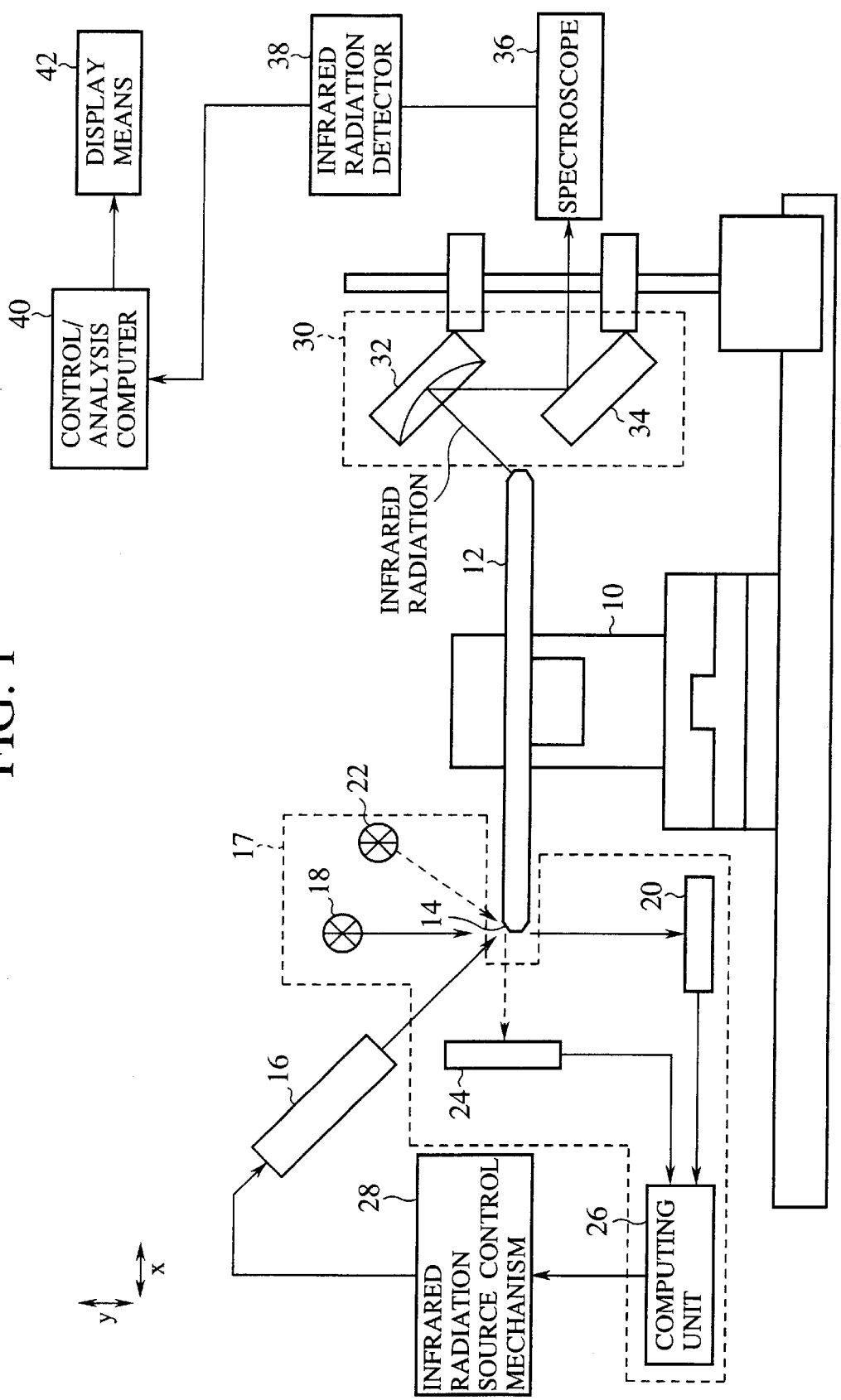
FIG. 1 is a schematic view of the surface state monitoring apparatus according to a first embodiment of the present invention.

As described above, the above-described conventional surface state monitoring methods are not usable in the in-situ monitoring at site of fabricating semiconductor devices because the monitoring by these method is destructive, or these methods are not suitable for monitoring large semiconductor wafers. Surface state monitoring methods and apparatuses which permit the in-situ monitoring of substrate surfaces at site of fabricating semiconductor devices, and permit large wafers to be monitored have been expected.

In view of the above, the inventors of the present application have already proposed an organic contaminant detecting method using wafer internal multiple reflection Fourier transformation infrared spectroscopy (see, e.g., the specification of Japanese Patent Application No. 95853/1999). It should be noted that Japanese Patent Application No. 95853/1999 (Laid-Open Publication No. 2000-55815 published Feb. 25, 2000) is not prior art against the present invention. This publication is introduced here only to show the conventional technology known to the inventors of the present invention.

When infrared radiation is applied to one end of a wafer at a specific incidence angle, the infrared radiation propagates inside the wafer, repeating total reflections on both surfaces. The infrared radiation oozes the surfaces of the wafer (evanescent waves), and a part of infrared spectra is absorbed by organic contaminants staying on the surfaces. The propagated infrared radiation emitted at the other end of the wafer is spectroscopically analyzed by FT-IR to thereby detect and identify the organic contaminants staying on the surfaces of the wafer. This monitoring method has sensitivity equal to GC/MS, and in addition thereto the monitoring has real time, and simple and economical.

In the surface state monitoring method described in the specification of Japanese Patent Application No. 95853/1999, the offset shape of a wafer is used to induce infrared radiation into the wafer at the declined faces of the peripheral edge of the wafer. Accordingly, it is not necessary to machine the semiconductor wafer itself, which permits the in-situ monitoring in the process for fabricating a semiconductor device.

In the surface state monitoring method described in the specification of Japanese Patent Application No. 95853/1999, it is important that infrared radiation is incident on a sloped part of a semiconductor wafer at a suitable position and at a suitable angle. Unless infrared radiation is incident on the sloped part at a suitable position and at a suitable angle, times of total reflections of the infrared radiation inside the semiconductor wafer vary, which leads to monitoring sensitivity variation.

However, it has been actually difficult to apply infrared radiation to the declined face of the peripheral edge of a semiconductor wafer at a suitable position and at a suitable angle. It is considered that, for example, an operator finds by gauging means a region of the declined faces of a semiconductor wafer having a certain declination, and infrared radiation is applied to the region. This unpractically affects a throughput of all steps as a whole.

In order to monitor organic contaminants and chemical contaminants on substantially all the surfaces of a semiconductor wafer, the semiconductor wafer has to be rotated, but only a little deflection of the rotary axis deviates a position of the peripheral edge of the wafer with respect to infrared radiation. When a position of a peripheral edge of a semiconductor wafer is deviated, the semiconductor wafer must be again positioned. This is a factor for further lowering a throughput of all steps as a whole.

A technique for applying infrared radiation to a declined face of a semiconductor wafer at a suitable position and at a suitable angle without affecting a throughput of all steps as a whole has been much expected.

[A First Embodiment]

The surface state monitoring apparatus and method according to a first embodiment of the present invention will be explained with reference to FIG. 1. FIG. 1 is a schematic view of the surface state monitoring apparatus according to the present embodiment.

(Surface State Monitoring Apparatus)

A general constitution of the surface state monitoring apparatus according to the present embodiment will be explained with reference to FIG. 1.

The surface state monitoring apparatus according to the present embodiment comprises, as shown in FIG. 1, a substrate mount 10 for mounting a semiconductor wafer 12, an infrared radiation source 16 for emitting infrared radiation, position detecting means 17 for detecting a positional deflection of the semiconductor wafer 12, an infrared radiation source control mechanism 28 for controlling a position and an angle of the infrared radiation source 16, infrared radiation converging means (detection optical system) 30 for converging infrared radiation which has exited the semiconductor wafer 12 after multiple reflections inside the semiconductor wafer 12, so as to apply the infrared radiation to an infrared radiation detector 38, and the infrared radiation detector 38 for detecting the infrared radiation from the infrared radiation converging means 30.

The position detecting means 17 comprises two laser beam sources 18, 22, two CCD (Charge Coupled Device) linear sensors 20, 24, and a computing unit 26. The position detecting means 17 is connected to the infrared radiation source control mechanism 28. The infrared radiation control mechanism 28 adjusts a position and an angle of the infrared radiation source 16 corresponding to a positional deflection of a semiconductor wafer 12 detected by the position detecting means 17.

Infrared radiation converged by the infrared converging means 30 is applied to the infrared radiation detector 38 through a spectroscope 36. The infrared radiation detector 38 is connected to a control/analysis computer 40 and analyzes surface states of a semiconductor wafer 12, based on detected signals supplied by the infrared radiation detector 38. The control/analysis computer 40 is connected to display means 42. The display means 42 displays analysis results of the detected signals analyzed by the control/analysis computer 40, and displays results of analysis of the detected signals by the control/analysis computer 40 and results of data base retrieval.

The surface state monitoring apparatus according to the present embodiment is mainly characterized in that the position detecting means 17 which detects a positional deflection of a semiconductor wafer 12, and a position and an angle of the infrared radiation source 16 are adjusted based on the detected positional deflection by the positional deflection detecting means 17. According to the present embodiment, a position and an angle of the infrared radiation source 16 can be quickly adjusted, corresponding to a positional deflection of a semiconductor wafer 12, whereby infrared radiation can be incident on a declined face of a semiconductor wafer 12 at a suitable position and at a suitable angle without affecting a throughput of steps as a whole. Even when a position of the peripheral edge of a semiconductor wafer is deflected by being rotated, a position and an angle of the infrared radiation source 16 can be quickly adjusted, corresponding to the positional deflection of the semiconductor wafer 12. Accordingly, organic contamination and chemical contamination can be monitored on substantially all the surfaces of a semiconductor wafer without affecting a throughput of steps as a whole.

Next, the constituent members of the surface state monitoring apparatus according to the present embodiment will be respectively detailed. About the monitoring system, reference is made to the specification of Japanese Patent Application No. 95853/1999. The various monitoring systems described in the specification are applicable to the surface state monitoring apparatus and method according to the present embodiment.

(a) Substrate Mount 10

The substrate mount 10 mount a semiconductor wafer 12 which is to be monitored.

The substrate mount 10 has a rotary mechanism, and can be rotated. The semiconductor wafer 12 is rotated, so that organic contamination and chemical contamination can be detected on substantially all the surfaces of the semiconductor wafer 12.

(b) Infrared Radiation Source 16

The infrared radiation source 16 is disposed on the periphery of the substrate mount 10, and exit substantially parallel rays of infrared radiation to the declined face 14 of the peripheral edge of a semiconductor wafer 12.

Infrared radiation emitted by the infrared radiation source 16 functions probing radiation for detecting organic contaminants, etc. staying on the surfaces of the semiconductor wafer 12.

A position and an angle of the infrared radiation source 16 is adjusted by the infrared radiation source control mechanism 28, so that infrared radiation can be incident on the declined face of the peripheral edge of a semiconductor wafer 12 at a suitable position and at a suitable angle.

(c) Incident Position and Incident Angle of Infrared Radiation

Significance of applying infrared radiation to the declined part of the peripheral edge of a semiconductor wafer 12 at a suitable position and at a suitable angle will be detailed.

The configuration of the end surface of semiconductor wafers are determined by SEMI (Semiconductor Equipment and Material International), which is an international semiconductor-related industrial association. Specifications of 300 mm-semiconductor wafer, which is to be introduced around 2001, are temporarily determined.

Figure 2:
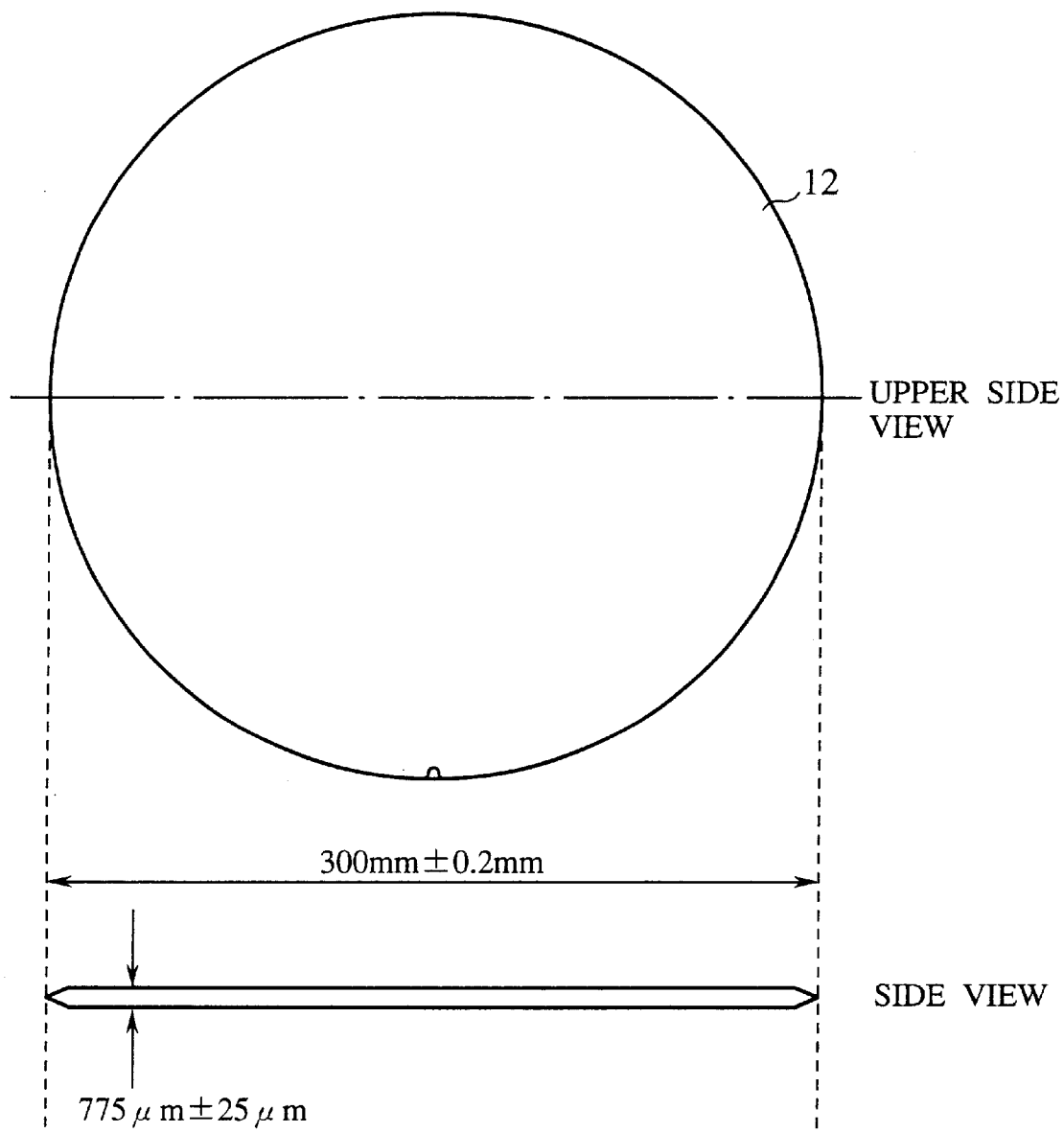
FIG. 2 is a view showing the configuration of a 300 mm-wafer according to SEMI standards.
Figure 3:
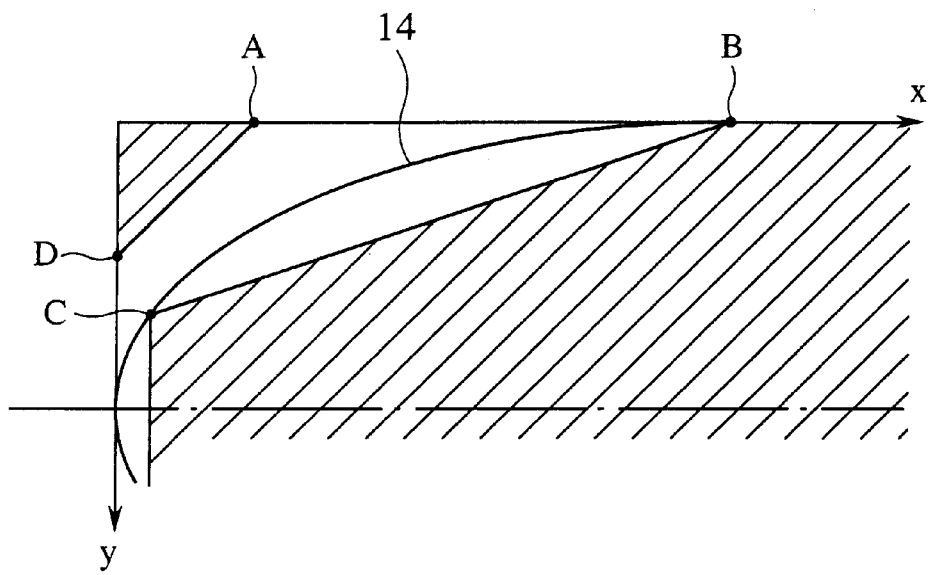
FIG. 3 is a view showing the shape of the peripheral edge of a 300 mm-wafer according to SEMI standards.

A 300 mm-semiconductor wafer specified by SEMI standards is as exemplified in FIG. 2. That is, a 300 mm-semiconductor wafer 12 is formed in a disc of a 300 mm-diameter and a 775 μm-thickness and has the borders between a pair of surfaces and the outer peripheral surface chamfered. A machined shape of the declined faces 14 of the chamfered semiconductor wafer 12 are as shown in FIG. 3. In FIG. 3, the region which is not hatched is an allowable range for configuration processing.

The 300 mm-semiconductor wafer specified by SEMI standards have both surfaces mirror-finished in the final machined configuration, and can be used as it is for the analysis method using infrared radiation internal multiple reflection, which requires both surfaces be mirror-finished.

When infrared radiation is applied to the declined face 14 of such semiconductor wafer, the infrared radiation undergoes multiple reflections inside the semiconductor wafer as follows.

Figure 4:
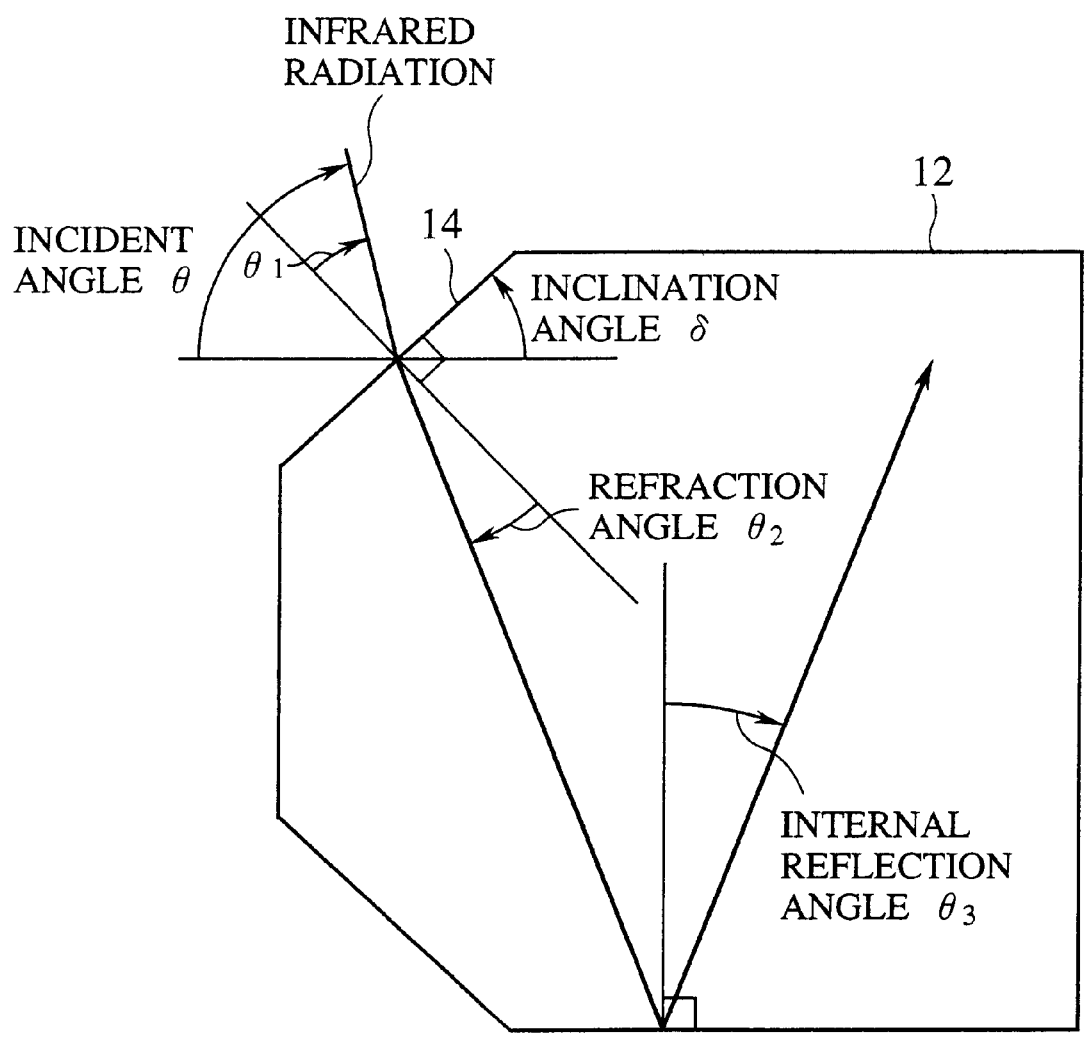
FIG. 4 is a conceptual view showing relationships between incident angles of infrared radiation and internal reflection angles thereof.

That is, as shown in FIG. 4, an incident angle $\theta_1$ of infrared radiation with respect to a normal to the declined face 14 is given by $$\theta_1=\theta-(90°-\delta)$$

when an inclination angle of the declined face 14 with respect to the horizontal surface of a semiconductor wafer 12 is represented by δ, an incident angle of infrared radiation with respect to the horizontal surface of the semiconductor wafer 12 is represented by θ.

When infrared radiation is incident on the declined face 14, the infrared radiation is refracted on the surface of the declined face 14 due to refractive index difference between air and silicon. When a refraction angle of infrared radiation which has entered a semiconductor wafer 12 is represented by $\theta_2$, $$\theta_2=\sin^{-1}((n_{air}/n_{si})\sin\theta_1)$$

is expressed by using Snell's law. The refractive index of air is $n_{air}=1$, and that of silicon is $n_{si}=3.42$.

The infrared radiation which has entered the semiconductor wafer 12 reflects inside the semiconductor wafer 12. When an internal reflection angle to a normal with respect to the horizontal surface of the semiconductor wafer 12 is represented by $\theta_3$, $$\theta_3=\delta-\theta_2$$

is expressed.

Figure 5:
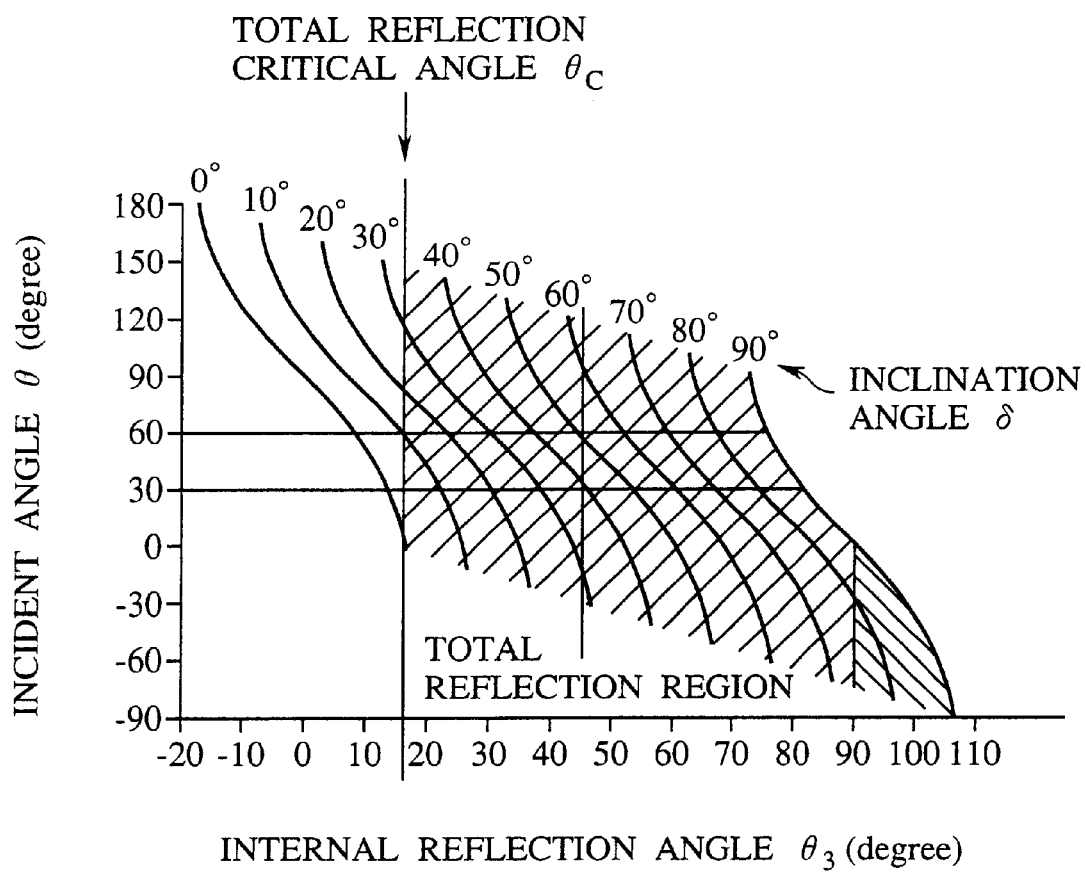
FIG. 5 is a graph of relationships between internal reflection angles and incident angles.

The declined faces of actual semiconductor wafers 12 are not plane as shown in FIG. 3, and an inclination angle δ differs depending on positions of incidence of infrared radiation. Accordingly, an inclination angle δ is not uniquely determined. FIG. 5 is a graph of relationships between internal reflection angles $\theta_3$ and incident angles θ with an inclination angle δ changed.

In order that infrared radiation which has entered a semiconductor wafer 12 repeats internal reflections inside the semiconductor wafer 12 and exits the semiconductor wafer 12 at an opposite side, it is necessary that an internal reflection angle $\theta_3$ is lager than a total reflection critical angle $\theta_c$. This is because internal reflections are repeated many times inside a semiconductor wafer 12, and reflected light other than totally reflected light attenuates to ignorable intensities.

A total reflection critical angle $\theta_c$ is $$\theta_c=\sin^{-1}(1/n_{si})=17°.$$

The less densely hatched region is a region where internal reflection angle $\theta_3$ is larger than a total reflection critical angle $\theta_c$. As seen in FIG. 5, when an inclination angle δ is above 33°, an internal reflection angle $\theta_3$ satisfies conditions for the total reflection even with an incident angle θ varied.

In FIG. 5, the densely hatched region is a region where an internal reflection angle $\theta_3$ is above 90°. In this case, the first reflection of infrared radiation does not take place inside of a semiconductor wafer 12 but takes place outside of the semiconductor wafer 12.

As seen in FIG. 5, in order that infrared radiation undergoes multiple internal reflections it is necessary that an incident angle θ is within 147° to −90°.

A time N of internal reflections of infrared radiation incident on a semiconductor wafer 12 is given by $$N 32 \phi/d \times \tan\theta_3$$

when an internal reflection angle is represented by $\theta_3$, a thickness of the semiconductor wafer 12 is represented by d, and a diameter of the semiconductor wafer 12 is represented by φ.

Figure 6:
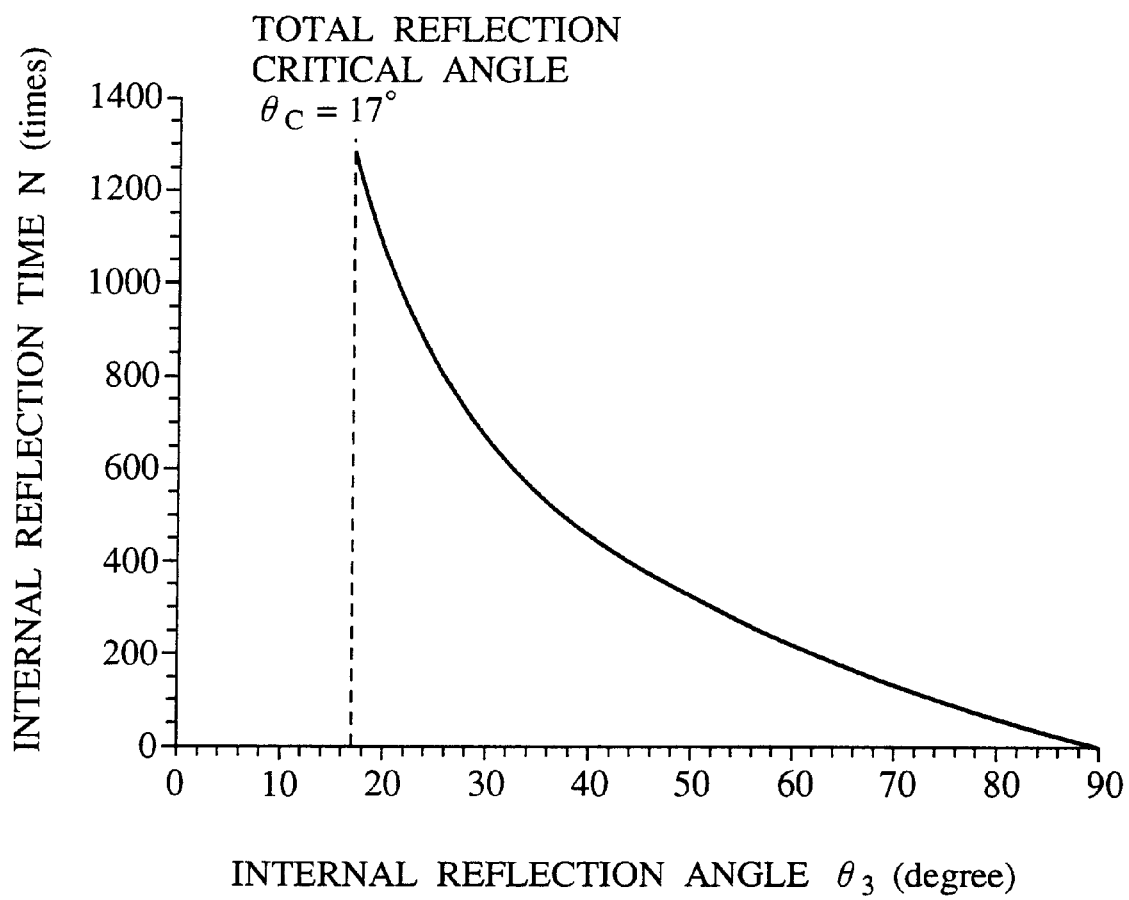
FIG. 6 is a graph of relationships between internal reflection angles and internal reflection times.

The above-described 300 mm-semiconductor wafer according to SEMI standards has a diameter φ of 300 mm, and a thickness d of 775 μm. A time N of internal reflections is as shown in FIG. 6. FIG. 6 is a graph of relationships between internal reflection angles $\theta_3$ and times N of internal reflections.

As shown in FIG. 6, when an internal reflection angle $\theta_3$ is a total reflection critical angle $\theta_c=17°$ of silicon-air, an internal reflection time N is 1266 times at maximum. The internal reflection time N decreases as the internal reflection angle $\theta_3$ becomes larger.

An amount of absorption of infrared radiation by organic contaminants staying on the surfaces of a semiconductor wafer 12 is proportional to an internal reflection time N of internal reflections inside the semiconductor wafer 12. When an internal reflection time N of internal reflections changes due to a positional deflection of a semiconductor wafer 12 or a configuration difference of the declined faces 14 of the semiconductor wafer 12, an amount of infrared radiation absorption changes even when a staying amount of organic contaminants, etc. is the same. Accordingly, the change of times N of internal reflections in a semiconductor wafer 12 is a factor for causing monitoring errors.

Thus, an internal reflection time N of infrared radiation inside a semiconductor wafer 12 is determined by an internal reflection angle $\theta_3$, and a degree of an internal reflection angle $\theta_3$ is determined by an inclination angle δ and an incident angle θ of infrared radiation.

Accordingly, for precise quantitative analysis, even when the declined faces 14 of a semiconductor wafer 12 have a different configuration it is necessary that infrared radiation is incident on a region of a certain inclination angle δ and at a certain incident angle θ so as to keep an internal reflection angle $\theta_3$ constant.

The above means that in order to retain a monitoring error of the quantitative analysis within a certain range it is necessary to keep constant an absorbing amount of infrared radiation for a certain amount of contamination, and to this end it is necessary to keep an internal reflection time N within a certain range.

Changes of an absorbing amount of infrared radiation due to internal reflection angle $\theta_3$ deflections and an internal reflection time N deflections are given as a simple evaluation by the following computation.

When it is simply considered that an infrared radiation absorbing amount is proportional to an internal reflection time N, deflections of an infrared radiation absorbing amount is caused by deflections of an internal reflection time N. In the organic contaminant detecting method using wafer multiple reflection Fourier-transform infrared radiation spectroscopy, organic contaminants are quantized by infrared radiation absorbing amounts, and deflections of an internal reflection time N determines monitoring errors of the quantitative analysis.

An internal reflection time N is given, as described above, by $$N=\phi/d\times\tan\theta_3.$$

Reflection times which are ±10% of a reflection time for one degree of the internal reflection angle $\theta_3$ are computed. Based on this result, an internal reflection angle $\theta_3$ for an internal reflection time N which is increased by 10% and an internal reflection angle $\theta_3$ for an internal reflection time N which is decreased by 10% are inversely computed, and a difference between the two angles is considered as a deflection of an internal reflection angle.

Figure 7:
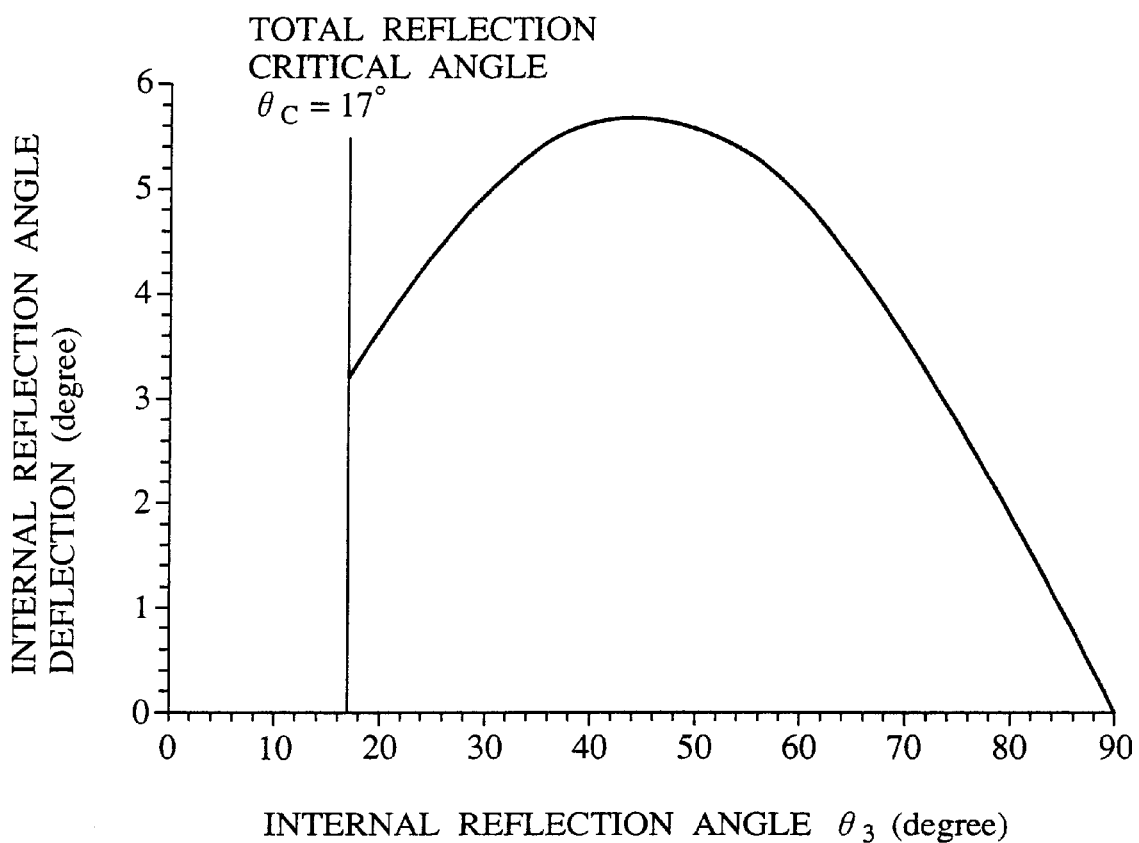
FIG. 7 is a graph of relationships between internal reflection angles and internal reflection angle deflection.

FIG. 7 shows results of the computation. As seen in FIG. 7, when an internal reflection angle $\theta_3$ is 45°, a deflection of the internal reflection angle is a maximum value of 5.7°. This result shows that a deflection of the internal reflection angle must be depressed to be within ±2.8° at maximum, and an internal reflection angle $\theta_3$ must be correctly controlled.

As seen in FIG. 7, an internal reflection angle $\theta_3$ is determined by an incident angle $\theta$ of infrared radiation on the declined face 14 and an inclination angle $\delta$ of the declined face 14. For example, when infrared radiation is applied at an incident angle $\theta$ of 30° to 60° so that an internal reflection angle $\theta_3$ is 45°, the infrared radiation must be incident on a region where an inclination angle $\delta$ of the declined face 14 is 40° to 50°.

In order to thus control an internal reflection angle $\theta_3$ correctly, it is necessary that an incident angle of infrared radiation on the declined face 14 is correctly controlled. It is also necessary that even when the declined face 14 of a semiconductor wafer 12 has a different configuration, it is necessary that a region having a certain inclination angle $\delta$ is detected, and infrared radiation is incident on the region.

(d) Position Detecting Means 17

The position detecting means 17 includes two laser beam sources 18, 22, two CCD linear sensors 20, 24 and a computing unit 26.

The laser beam source 18 is disposed on the periphery of the substrate mount 10 and applies downward substantially parallel laser beams. The laser beam source 18 applies laser beams to a region of the declined face 14 of a semiconductor wafer 12, which contains a region for infrared radiation to be applied to.

On the other hand, the CCD linear sensor 20 is disposed below the laser beam source 18 and has picture elements arranged in the X direction, i.e., in the radial direction of a semiconductor wafer 12.

Part of laser beams emitted downward by the laser beam source 18 is blocked by a semiconductor wafer 12, and that alone of the laser beams which is not blocked by the semiconductor wafer 12 arrives at the CCD linear sensor 20. Accordingly, the picture elements of the CCD linear sensor 20 sense the laser beams corresponding to a positional deflection of the semiconductor wafer 12 in the X-direction.

The laser beam source 22 is disposed on the periphery of the substrate mount 10 and is located inner of the peripheral edge of a semiconductor wafer 12. The laser beam source 22 emits laser beams converged thin toward the declined face 14 of a semiconductor wafer 12.

On the other hand, the CCD linear sensor 24 is disposed on a side of the substrate mount 10 and has picture elements arranged in the Y-direction, i.e., the vertical direction.

Laser beams emitted by the laser beam source 22 to the declined face 14 of a semiconductor wafer 12 incident on a region of the declined face of the semiconductor wafer 12, which is substantially a region for infrared radiation to be incident on.

Laser beams emitted by the laser beam source 22 are reflected on the declined face 14 of a semiconductor wafer 12 and arrive at the CCD linear sensor 24. Accordingly, the picture elements of the CCD linear sensor 24 sense the laser beams corresponding to a positional deflection of the semiconductor wafer 12 in the Y-direction.

Signals detected by the respective CCD linear sensors 20, 24 are inputted to the computing unit 26. The computing unit 26 computes a positional deflection of a semiconductor wafer 12 in the X direction, based on signals supplied by the CCD linear sensor 20 and in the Y direction, based on signals supplied by the CCD linear sensor 24.

The computing unit 26 generates feedback signals for controlling a position and an angle of the infrared radiation source 16, corresponding to an X-directional positional deflection and a Y-directional positional deflection of a semiconductor wafer 12. That is, the computing unit 26 computes how much change of a position and an angle of the infrared radiation source 16 makes infrared radiation incident on the declined face 14 of a semiconductor wafer 12 at a suitable position, and feeds back a computed result to the infrared radiation source control mechanism 28.

Diameters of semiconductor wafers 12 and configurations of the declined faces 14 are often different among makes and types. For example, semiconductor wafers according to SEMI standards often have diameters which vary in the range shown in FIG. 2, and often have configurations of the declined faces 14 which vary in the range shown in FIG. 3. Accordingly, it is preferable to suitably set the laser beam sources 18, 22 and the CCD linear sensors 20, 24 at suitable positions.

When the computing unit 26 computes a Y-directional positional deflection of a semiconductor wafer 12, the Y-directional positional deflection may be computed in consideration of a configuration of the declined faces 14 of the semiconductor wafer 12. In this case, data of configurations of the declined faces of semiconductor wafers of respective types of respective makers are stored in a memory (not shown), and suitable one of the data is supplied to the computing unit 26 in accordance with a semiconductor wafer to be monitored. A positional deflection of a semiconductor wafer 12 is detected in consideration of a diameter of the semiconductor wafer 12 and a configuration of the declined faces 14, whereby the positional deflection of the semiconductor wafer 12 can be monitored without resetting positions of the laser beam sources 18, 22 and the CCD linear sensors 20, 24.

(e) Infrared Radiation Source Control Mechanism 28

The infrared radiation source control mechanism 28 controls a position and an angle of the infrared radiation source 16, based on feedback signals from the computing unit 26.

The infrared radiation source control mechanism 28 quickly controls a position and an angle of the infrared radiation source 16 corresponding to a positional deflection of the semiconductor wafer 12, whereby infrared radiation can be incident on the declined face 14 of a semiconductor wafer 12 at a suitable position without affecting a throughput of steps as a whole.

(f) Detection Optical System 30

The detection optical system (infrared radiation converging means) 30 comprises two reflection mirrors 32, 34.

Infrared radiation which has been applied by the infrared radiation source 16 and entered the inside of a semiconductor wafer 12 repeats internal reflections inside the semiconductor wafer 12, probing the surfaces of the semiconductor wafer 12 to accumulate information of contamination on the surfaces of the substrate, and exits at a position symmetrical to the incidence point of the infrared radiation to be introduced into the detection optical system 30.

The detection optical system 30 converges the infrared radiation exiting the semiconductor wafer 12 and guides the infrared radiation to the spectroscope 36.

(g) Spectroscope 36

The spectroscope 36 is a spectroscope of an FT-IR apparatus for spectral diffraction of infrared radiation by, e.g., the mechanism of Fourier-transform spectroscopy using a double beam interferometer (Michelson Interferometer).

Infrared radiation diffracted into spectra by the spectroscope 36 is introduced into the infrared radiation detector 38.

(h) Infrared Radiation Detector 38

The infrared radiation detector 38 is a detector of, e.g., an FT-IR apparatus and can be provided by an infrared radiation detector of, e.g., InSb of nitrogen-cooling type.

When infrared radiation enters a semiconductor wafer 12 and undergoes multiple reflections inside the semiconductor wafer, and frequency components of light (evanescent waves) oozing when the radiation reflects on the surfaces of the substrate agree with molecular vibration frequencies of organic contaminants on the surfaces of the wafer, the frequency components are resonance absorbed. The infrared absorption spectra are analyzed to identify kinds and quantities of the organic contaminants.

Monitored data of thus given spectra are supplied to a control/analysis computer 40.

(i) Control/Analysis Computer 40

The control/analysis computer 40 identifies organic contaminants and computes quantities of the organic contaminants.

The memory of the control/analysis computer 40 stores separately as data base kinds and calibration curves. Monitored data are quantized with reference to the data. Results thus analyzed can be displayed on display means 42.

(Surface Sate Monitoring Method)

Then, the surface state monitoring method according to the present embodiment will be explained with reference to FIG. 1.

First, a semiconductor wafer 12 which is an object to be monitored is placed on the substrate mount 10. The semiconductor wafer 12 is one to be used in a semiconductor device fabrication line.

Next, laser beams are applied downward from the laser beam source 18. That alone of the laser beam applied by the laser beam source 18, which has not been blocked by the semiconductor wafer 12 arrives at the CCD linear sensor 20. A signal corresponding to an X-directional positional deflection of the semiconductor wafer 12 is outputted to the computing unit 26 by the CCD linear sensor 20.

Laser beams are applied to a peripheral part of the semiconductor wafer 12 by the laser beam source 22. The laser beams emitted by the laser beam source 22 are reflected on the declined face 14 of the semiconductor wafer 12 and arrives at the CCD linear sensor 24. A signal corresponding to a Y-directional positional deflection is outputted to the computing unit 26 by the CCD linear sensor 24.

The computing unit 26 computes the X-directional positional deflection of the semiconductor wafer 12, based on the signal inputted by the CCD linear sensor 20, and computes the Y-directional positional deflection, based on the signal inputted by the CCD linear sensor 24. Then, the computing unit 26 generates a feedback signal for controlling a position and an angle of the infrared radiation source 16, based on a computed result of the X-directional positional deflection and a computed result of the Y-directional positional deflection. At this time, as described above, the computation may be made in consideration of a maker, a type, specifications, etc.

The feedback signal outputted by the computing unit 26 is inputted to the infrared radiation source control mechanism 28. The infrared radiation source control mechanism 28 controls a position and an angle of the infrared radiation source 16, based on the feedback signal outputted by the computing unit 26. Thus, the infrared radiation source 16 is positioned so that infrared radiation is incident on the declined face 14 of the semiconductor wafer 12 at a suitable position and at a suitable angle.

Then, infrared radiation is emitted by the infrared radiation source 16. The infrared radiation entering the semiconductor wafer 12 at the declined face 14 thereof repeats internal reflection, probing the surfaces of the substrate, accumulating information of contamination, and exits the semiconductor wafer 12 at a position symmetrical to the incident point of the infrared radiation. In the present embodiment, infrared radiation is incident on the declined face 14 of the semiconductor wafer 12 at a suitable position and at a suitable angle, whereby a time of total reflections inside the semiconductor wafer 12 is controlled to be a suitable time.

Then, the infrared radiation exiting the semiconductor wafer 12 is converged by the infrared radiation converging means (detection optical system) 30 to be introduced into the infrared radiation detector 38 through the spectroscope 36. Thus, absorption spectra corresponding to respective frequencies are given by the mechanism of Fourier-transform spectroscopy using, e.g., a double beam interferometer.

Then, data of the absorption spectra given by the infrared radiation detector 38 are inputted to the control/analysis computer 40. The control/analysis computer 40 analyzes the spectra to identify kinds and quantities of organic contaminants.

When organic contamination and chemical contamination are monitored substantially all over the surfaces of the semiconductor wafer 12, the semiconductor wafer 12 is rotated. In a case that the center of the semiconductor wafer 12 and the rotary shaft of the substrate mount 10 do not agree with each other, when the semiconductor wafer 12 is rotated, a position of the peripheral edge of the semiconductor wafer 12 is deflected. In the present embodiment, however, corresponding to a positional deflection of the semiconductor wafer 12, a position and an angle of the infrared radiation source 16 are quickly adjusted. Thus, according to the present embodiment, even when the semiconductor wafer 12 is rotated, organic contamination and chemical contamination can be monitored substantially all over the semiconductor wafer 12 without affecting throughput of steps as a whole.

Thus, the analysis of surface states of the semiconductor wafer 12 is completed.

According to the present embodiment, a positional deflection of a semiconductor wafer is detected, and a position and an angle of the infrared radiation source can be quickly adjusted, corresponding to the positional deflection of the semiconductor wafer. Accordingly, according to the present embodiment, infrared radiation can be incident on the declined face of a semiconductor wafer at a suitable position and at a suitable angle, whereby an internal reflection angle can be suitably controlled without affecting throughput of all steps as a whole. Accordingly, according to the present embodiment, a number of times of total reflections inside a semiconductor wafer can be suitably controlled, whereby surface states of the semiconductor wafer can be monitored with high accuracy.

Furthermore, according to the present embodiment, a position and an angle of the infrared radiation source can be quickly adjusted, corresponding to a positional deflection of a semiconductor wafer, whereby even in a case that a semiconductor wafer is rotated to monitor substantially all the surfaces thereof for organic contamination and chemical contamination, throughput of all steps as a whole are kept from being affected.

(Modification (Part 1))

Figure 8:
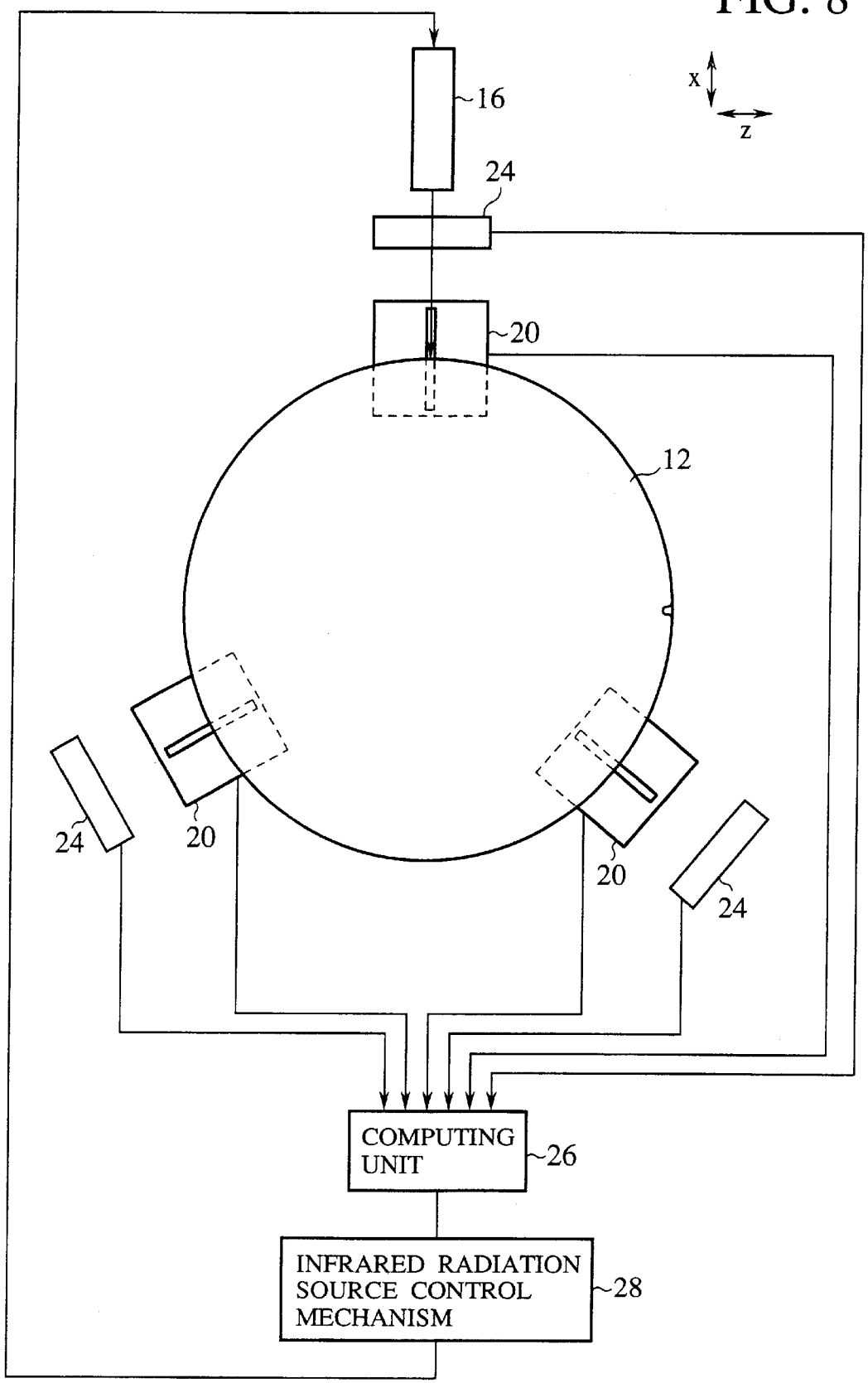
FIG. 8 is a schematic view of the surface state monitoring apparatus according to a variation (Part 1) of the first embodiment of the present invention.

Next, the surface state monitoring apparatus and method according to a modification (Part 1) of the first embodiment will be explained with reference to FIG. 8. FIG. 8 is a schematic view of the surface state monitoring apparatus according to the present modification. FIG. 8 is a view of the surface state monitoring apparatus according to the present modification as viewed from above a semiconductor wafer, and the laser radiation source, etc. are omitted.

As shown in FIG. 8, the surface state monitoring apparatus and method according to the present modification is characterized mainly in that a positional deflection of a semiconductor wafer 12 is detected at three positions. That is, three sets of the laser beam source (not shown) and the CCD linear sensors 20, 24 are arranged at every 120° to the center of a semiconductor wafer 12.

Signals indicative of a positional deflection detected by the CCD linear sensors 20, 24 at the three positions are inputted to one computing unit 26. The computing unit 26 collectively computes the positional deflection of the semiconductor wafer 12, based on the signals inputted by the CCD linear sensors 20, 24 disposed at the three positions, so as to generate feedback signals. The thus generated feedback signals are inputted to the infrared radiation source control mechanism 28, whereby a position and an angle of the infrared radiation source 16 are controlled.

In the surface state monitoring apparatus shown in FIG. 1 detects a positional deflection of a semiconductor wafer 12 at one position, which makes it difficult to detect a positional deflection of a semiconductor wafer 12, which is in the Z-direction, i.e., vertically to the drawing sheet of FIG. 1.

In the present modification, a positional deflection of a semiconductor wafer 12 is detected at the three positions, whereby a positional deflection which is in the Z-direction of the semiconductor wafer 12, i.e., horizontally to the drawing sheet of FIG. 8 can be detected.

As described above, in the present modification, a positional deflection of a semiconductor wafer is detected at the three positions, whereby a positional deflection even in the Z-direction of a semiconductor wafer can be detected. Thus, according to the present modification, infrared radiation can be incident with higher accuracy on the declined face of a semiconductor wafer at a suitable position and a suitable angle, whereby surface states of the semiconductor wafer can be monitored with higher precision.

(Modification (Part 2))

Figure 9:
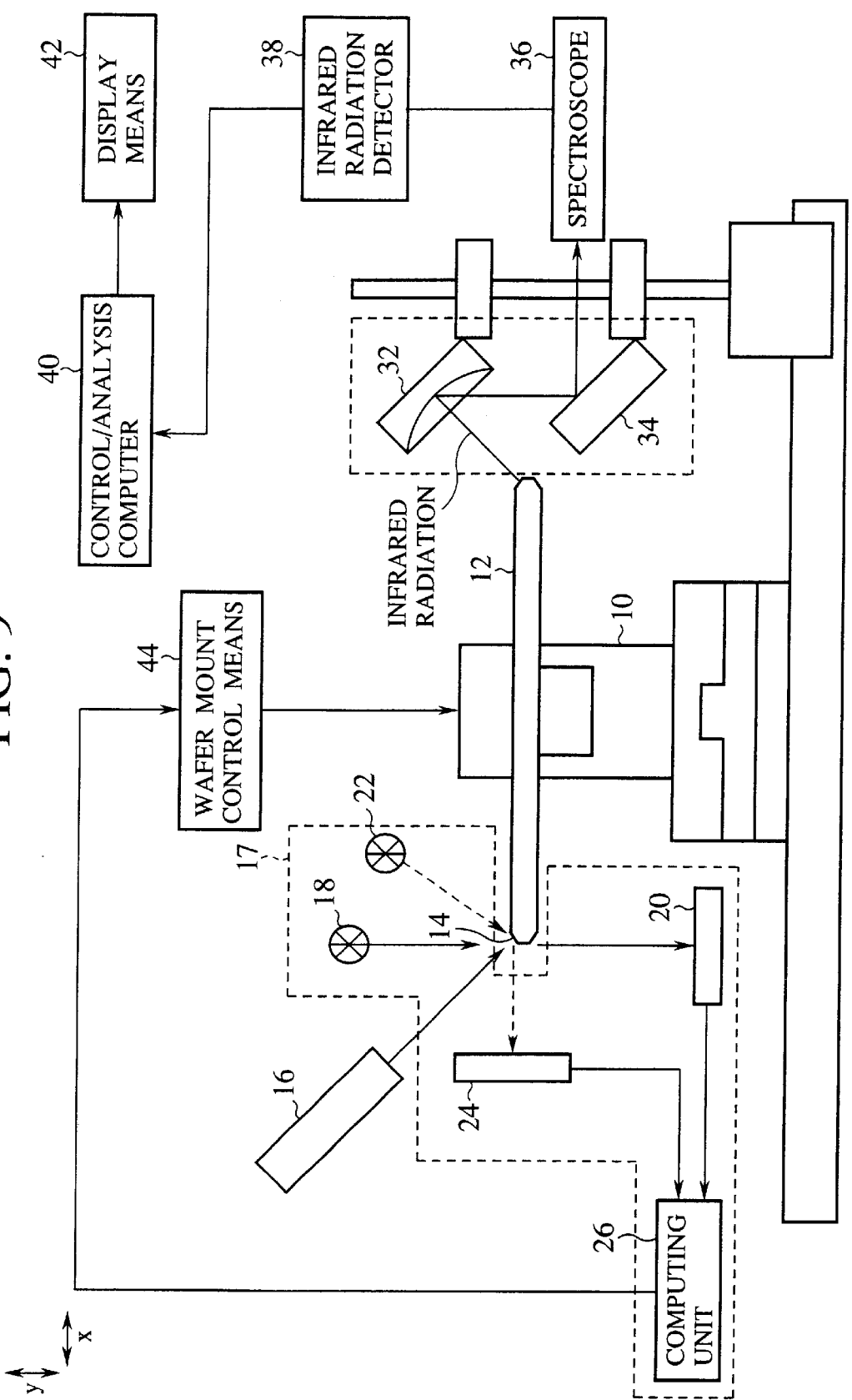
FIG. 9 is a schematic view of the surface state monitoring apparatus according to a variation (Part 2) of the first embodiment of the present invention.

Next, a modification (Part 2) of the surface state monitoring apparatus and method according to the first embodiment will be explained with reference to FIG. 9. FIG. 9 is a schematic view of the surface state monitoring apparatus according to the present modification.

As shown in FIG. 9, the surface state monitoring apparatus according to the present modification includes wafer mount control means 44 for controlling the wafer mount 10. Feedback signals are outputted by the computing unit 26 to the wafer mount control means 44.

The wafer mount 10 includes a position control mechanism (not shown) for adjusting a position of a semiconductor wafer. The substrate mount control means 44 suitably controls the position control mechanism of the wafer mount 10, based on feedback signals, whereby a positional deflection of a semiconductor wafer 12 is corrected.

In the surface state monitoring apparatus according to the first embodiment shown in FIG. 1, a position and an angle of the infrared radiation source 16 are controlled, whereby infrared radiation is incident on a semiconductor wafer 12 at a suitable position and at a suitable angle. In the surface state monitoring apparatus according to the present modification, however, the substrate mount 10 is controlled, whereby a positional deflection of a semiconductor wafer 12 is corrected. Thus, according to the present modification, infrared radiation can be incident on a semiconductor wafer 12 at a suitable position and at a suitable angle.

As described above, according to the present modification, the wafer mount is controlled by the wafer mount control means, whereby a positional deflection of a semiconductor wafer can be corrected. Thus, infrared radiation can be incident on the declined face at a suitable position and at a suitable angle.

[A Second Embodiment]

Figure 10:
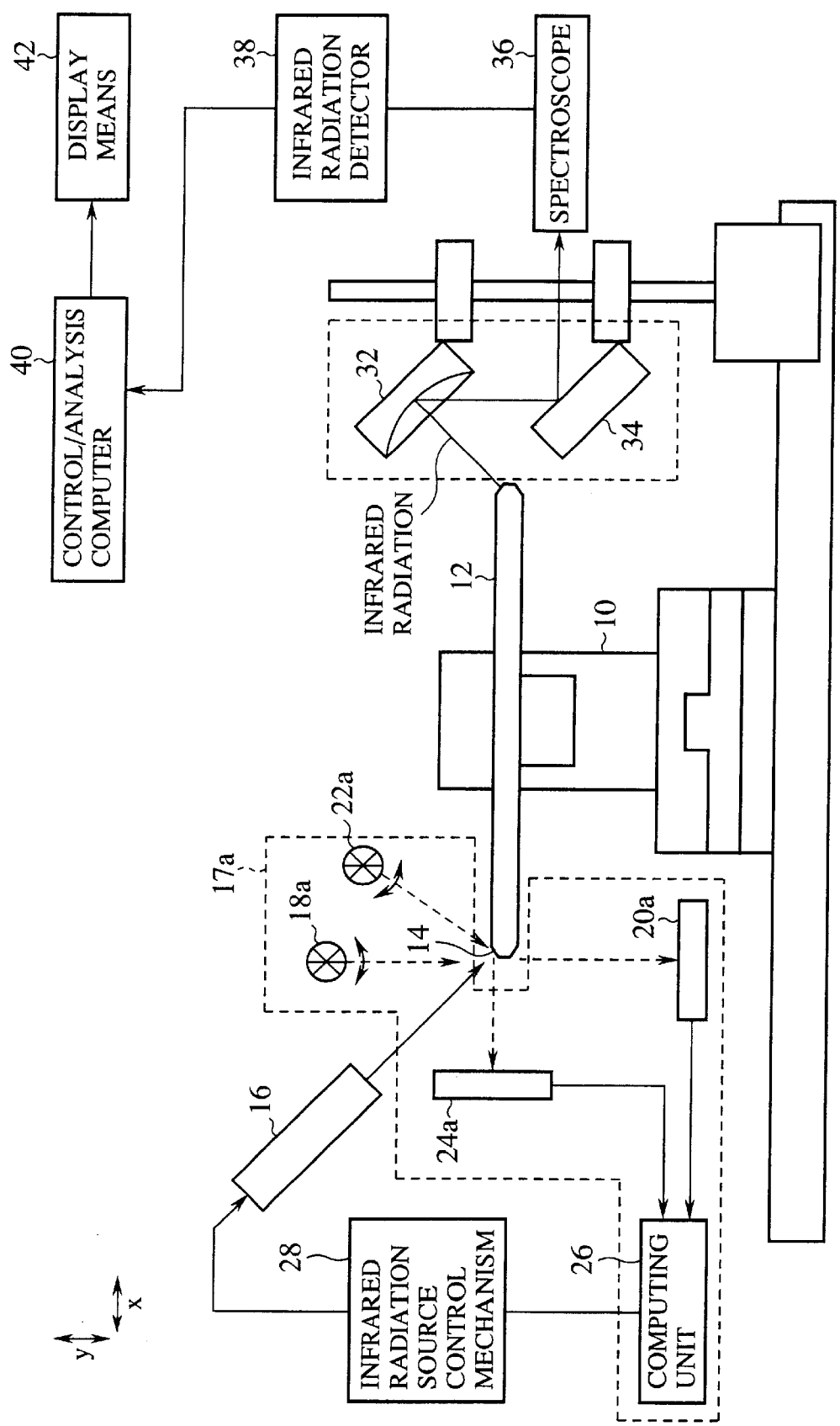
FIG. 10 is a schematic view of the surface state monitoring apparatus according to a second embodiment of the present invention.

The surface state monitoring apparatus and method according to a second embodiment of the present invention will be explained with reference to FIG. 10. FIG. 10 is a schematic view of the surface state monitoring apparatus according to the present embodiment. The same members of the present embodiment as those of the surface state monitoring apparatus and method according to the first embodiment shown in FIGS. 1 to 9 are represented by the same reference numbers not to repeat or to simplify the explanation.

(Surface State Monitoring Apparatus)

First, the surface state monitoring apparatus according to the present embodiment will be explained with reference to FIG. 10.

Position detecting means 17a of the present embodiment comprises two laser beam sources 18a, 22a, two CCD two-dimensional sensors 20a, 24a, and a computing unit 26.

The laser beam source 18a is disposed on the periphery of a wafer mount 10 and can scan in directions a laser beam which is converged thin. The CCD two-dimensional sensor 20a is disposed below the laser beam source 18a and has a number of picture elements arranged in plane.

The laser beam source 22a is disposed on the periphery of a wafer mount 10 and can scan in directions a laser beam which is converged thin. The CCD two-dimensional sensor 24a is disposed aside of the wafer mount 10 and has a number of picture elements arranged in plane, as has the CCD two-dimensional sensor 20a.

As in the first embodiment, the CCD two-dimensional sensors 20a, 24a are connected to a computing unit 26.

The surface state monitoring apparatus according to the present embodiment is characterized mainly in that the laser beam sources 18a, 22a which can scan laser beams in respective directions, and the CCD two-dimensional sensors 20a, 24a can detect the laser beams. In the present embodiment, laser beams are sensed by the CCD two-dimensional sensors 20a, 24a having a number of picture elements arranged in plane, whereby a positional deflection of a semiconductor wafer 12 can be with higher accuracy in comparison with the surface state monitoring apparatus according to the first embodiment, which includes the CCD linear sensors 20, 24 having linearly arranged picture elements.

In the present embodiment, which uses the CCD two-dimensional sensors 20a, 24a, a positional deflection of a semiconductor wafer 12 in not only the X-direction and Y-direction but also in the Z-direction, i.e., the direction vertical to the drawing sheet of FIG. 10 can be detected. In the first embodiment, as shown in the Modification (Part 1) shown in FIG. 8, unless a positional deflection is monitored at a plurality of positions, it is difficult to detect the positional deflection in the Z-direction. In the present embodiment, however, the CCD two-dimensional sensors 20a, 24a are used, whereby a positional deflection of a semiconductor wafer 12 in the Z-direction can be detected by the detection only at one position.

(Surface State Monitoring Apparatus)

Then, the surface state monitoring apparatus according to the present embodiment will be explained with reference to FIG. 10.

First, a semiconductor wafer 12 to be monitored is placed on the wafer mount 10, as is in the first embodiment.

Next, laser beams are emitted by the laser beam source 18a to the declined face 14 of a semiconductor wafer 12. The laser beam source 18a scan laser beams so that the laser beams are applied to a region of the declined face 14 of the semiconductor wafer 12, which contains a region for the infrared radiation to be incident on. That alone of the laser beams emitted by the laser beam source 18a, which has not been blocked by the semiconductor wafer 12 arrives at the CCD two-dimensional sensor 20a. The CCD two-dimensional sensor 20a inputs signals to the computing unit 26, corresponding to those of the picture elements which have sensed said that of the laser beams.

Laser beams are emitted to the declined face 14 of the semiconductor wafer 12 by the laser beam source 22a. The laser beams emitted by the laser beam source 22a are reflected on the declined face 14 of the semiconductor wafer 12 and arrive at the CCD two-dimensional sensor 24a. The CCD two-dimensional sensor 24a inputs signals to the computing unit 26, corresponding to those of the picture elements which have sensed the laser beams.

The computing unit 26 computes an X-directional positional deflection of the semiconductor wafer 12, based on the signal inputted by the CCD two-dimensional sensor 20a and computes a Y-directional positional deflection of the semiconductor wafer 12, based on the signals inputted by the CCD two-dimensional sensor 24a. The computing unit 26 also computes a Z-directional positional deflection of the semiconductor wafer 12, based on the signals inputted by the CCD two-dimensional sensors 20a, 24a. The computing unit 26 generates feedback signals for controlling a position and an angle of the infrared radiation source, based on results of the computation of the positional deflection. At this time, as in the first embodiment, the positional deflection of the semiconductor wafer 12 may be computed in consideration of a maker and type thereof.

The feedback signals generated by the computing unit 26 are outputted to the infrared radiation source control mechanism 28. The infrared radiation source control mechanism 28 controls a position and an angle of the infrared radiation source 16, based on the feedback signals from the computing unit 26.

Thus, the infrared radiation source 16 is positioned so as to apply infrared radiation to the declined face 14 of a semiconductor wafer 12 at a suitable position and at a suitable angle.

The following steps of the surface state monitoring apparatus according to the second embodiment is the same as those of the first embodiment, and their explanation is not repeated.

As described above, according to the present embodiment, the CCD two-dimensional sensors, which can provide much information, are used, whereby positional deflections of semiconductor wafers can be detected with high accuracy.

According to the present embodiment, the CCD two-dimensional sensors are used, whereby positional deflections of a semiconductor wafers can be detected even in the Z-direction by the monitor at one position. Accordingly, the surface state monitoring apparatus according to the second embodiment can be simple in the constitution and inexpensive.

[A Third Embodiment]

Figure 11:
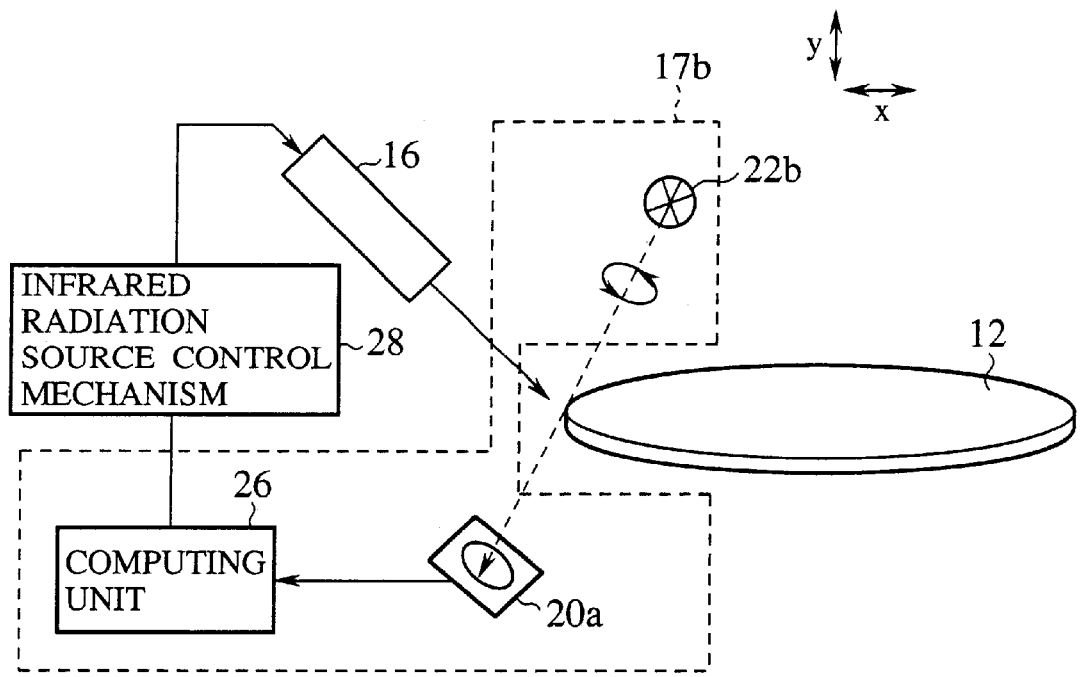
FIG. 11 is a schematic view of the surface state monitoring apparatus according to a third embodiment of the present invention.
Figure 12A:
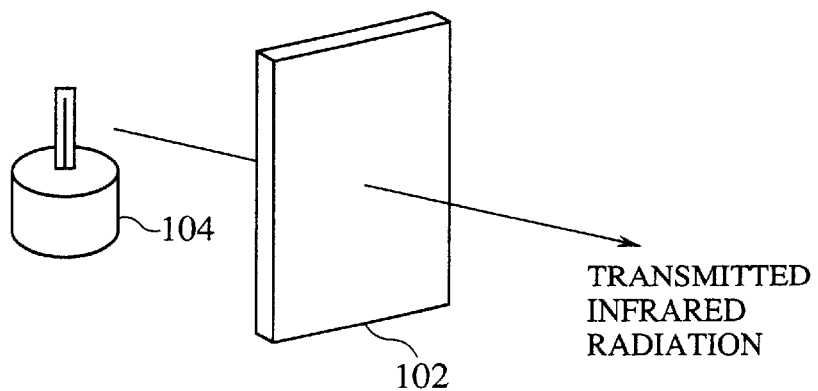
FIGS. 12A to 12C are schematic views explaining the conventional surface state monitoring apparatus and method.
Figure 12B:
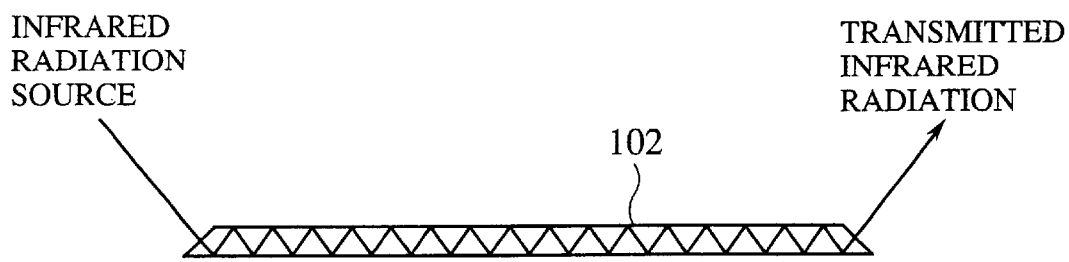
Figure 12C:
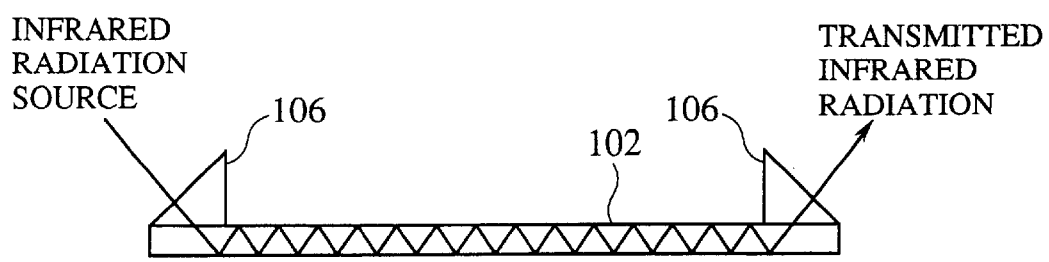

The surface state monitoring apparatus and method according to a third embodiment of the present invention will be explained with reference to FIG. 11. FIG. 11 is a schematic view of the surface state monitoring apparatus according to the present embodiment. The same members of the present embodiment as those of the surface state monitoring apparatus and method according to the first or the second embodiment shown in FIGS. 1 to 10 are represented by same reference numbers not to repeat or to simplify their explanation.

(Surface State Monitoring Apparatus)

The surface state monitoring apparatus according to the present embodiment will be explained with reference to FIG. 11.

Position detecting means 17b of the present embodiment comprises a laser beam source 22b, a CCD two-dimensional sensor 20a and a computing unit 26.

The laser beam source 22b is disposed above a wafer mount (not shown) and can scan in a closed trace. The laser beam source 22b can move laser beams in a closed trace of any shape, such as elliptical shape, rectangular shape or others.

The CCD two-dimensional sensor 20a is disposed diagonally below the laser beam source 22b and has a number of picture elements arranged in plane. The surface state monitoring apparatus shown in FIG. 11 uses the CCD two-dimensional sensor 20a, but in place of the CCD two-dimensional sensor 20a, a CCD quartered sensor or others may be suitably used.

The surface state monitoring apparatus according to the present embodiment is characterized in that the laser beam source moves laser beams in a closed trace. The laser beam source simply moves laser beams in a closed trace, whereby a positional deflection of a semiconductor wafer 12 can be detected. Accordingly, in comparison with the second embodiment, in which the scan is made in respective directions, the surface state monitoring apparatus according to the present embodiment can quickly detect positional deflections of a semiconductor wafer 12.

(Surface State Monitoring Method)

Then, the surface state monitoring method according to the present embodiment will be explained with reference to FIG. 11.

As in the first embodiment, a semiconductor wafer 12 to be monitored is placed on the wafer mount 10.

Then, laser beams are emitted by the laser beam source 22b to the declined face 14 of the semiconductor wafer 12. The laser beams emitted by the laser beam source 22b are traversed in a closed trace near an incident region of the declined face 14 of the semiconductor wafer 12, on which infrared radiation is incident. That alone of the laser beams emitted by the laser beam source 22b, which has not been blocked by the semiconductor wafer 12 arrives at the CCD two-dimensional sensor 20a. The CCD two-dimensional sensor 20a inputs to the computing unit 26 signals corresponding to those of the picture elements, which have sensed that of the laser beams.

The computing unit 26 computes a positional deflection of the semiconductor wafer 12, based on the signals inputted by the CCD two-dimensional sensor 20a. The computing unit 26 generates, based on results of the computation, feedback signals for controlling a position and an angle of the infrared radiation source 16. The feedback signals generated by the computing unit 26 are outputted to the infrared radiation source control mechanism 28. The infrared radiation control mechanism 28 controls a position and an angle of the infrared radiation source 16, based on the feedback signals from the computing unit 26.

Thus, the infrared radiation source 16 has a position and an angle set so as to apply infrared radiation to the declined face 14 of the semiconductor wafer 12 at a suitable position and at a suitable angle.

The following steps of the surface state monitoring method according to the present embodiment are the same as those of the first embodiment, and their explanation is not repeated.

As described above, according to the present embodiment, the laser beam source is used so that laser beams are traversed in a closed trace to detect a positional deflection of a semiconductor wafer, whereby the positional deflection of the semiconductor wafer can be more quickly detected. Furthermore, according to the present embodiment, one CCD two-dimensional sensor may be provided, which makes the surface state monitoring apparatus inexpensive.

MODIFICATIONS

The present invention is not limited to the above-described embodiment and can cover other various modifications.

For example, in the first to the third embodiments, the laser beam source is used. However, the laser beam source is not essential, and any radiation source can be suitably used as long as the radiation source emits radiation of wavelengths which are different from those of infrared radiation as a probing radiation.

In the first embodiment, the laser beam source 18 emits substantially parallel laser beams, and the laser beam source 22 emits a laser beam which is converged thin. It is possible that both the laser beam sources 18, 22 emit substantially parallel laser beams.

In the first and the second embodiments, a positional deflection is detected both in the X-directional and in the Y-direction, but both may not be essentially detected. That is, for example, when a Y-directional positional deflection is extremely small, an X-directional positional deflection alone may be detected. A Y-directional positional deflection alone may be detected without detecting an X-directional positional deflection.

In the second and the third embodiments, a positional deflection of a semiconductor wafer is detected only at one position, but may be detected at a plurality of positions, whereby positional deflections of semiconductor wafers can be detected with higher accuracy.

In the second and the third embodiments, a position and an angle of the infrared radiation source are controlled, but the wafer mount is controlled so as to control a positional deflection of a semiconductor wafer.

In the second embodiment, the CCD two-dimensional sensor is used, but a CCD linear sensor may be used.

In the third embodiment, one laser beam source and one CCD two-dimensional sensor are provided, but more laser sources and more CCD two-dimensional sensors may be provided, whereby positional deflections of semiconductor wafers can be detected with higher accuracy.

In the first to the third embodiments, the position detection is made on semiconductor wafers, but may be made any substrates to be monitored other than semiconductor wafers.

What is claimed is:

1. A surface state monitoring apparatus comprising:
   an incidence optical system for introducing infrared radiation into a substrate-to-be-monitored via a declined face of a peripheral edge of the substrate-to-be-monitored;
   a detection optical system for detecting the infrared radiation undergoing multiple reflections inside the substrate-to-be-monitored and exiting from the substrate-to-be-monitored;
   a surface state monitoring means for monitoring a surface state of the substrate-to-be-monitored, based on infrared radiation detected by the detection optical system;
   a position detecting means for optically detecting a position of the substrate-to-be monitored; and
   a control means for controlling a position and an angle at which the infrared radiation is incident on the substrate-to-be-monitored, corresponding to the position of the substrate-to-be-monitored detected by the position detecting means,
   wherein the position detecting means optically detects a position of the substrate-to-be-monitored in consideration of a configuration of the declined face of the peripheral edge of the substrate-to-be-monitored.

2. A surface state monitoring apparatus according to claim 1, wherein
   the control means controls the incidence optical system to thereby control a position and an angle at which the infrared radiation is incident on the substrate-to-be-monitored.

3. A surface state monitoring apparatus according to claim 1, wherein
   the control means controls a wafer mount on which the substrate-to-be-monitored is mounted to adjust a position of the substrate-to-be-monitored to thereby control a position and an angle at which infrared radiation is incident on the substrate-to-be-monitored.

4. A surface state monitoring apparatus according to claim 1, wherein
   the position detecting means is disposed above the peripheral edge of the substrate-to-be-monitored, and includes a first radiation source for applying first radiation to the peripheral edge of the substrate-to-be-monitored and a first photo detector disposed opposed to the first radiation source across the peripheral edge of the substrate-to-be-monitored, for detecting the first radiation; and
   the position detecting means detects a position of the substrate-to-be-monitored in the horizontal direction, based on a position of radiation detected by the first photo detector.

5. A surface state monitoring apparatus according to claim 4, wherein
   the position detecting means includes a second radiation source for applying second radiation to the peripheral edge of the substrate-to-be-monitored and a second photo detector for detecting the second radiation reflected by the peripheral edge; and
   the position detecting means detects a vertical position of the substrate-to-be-monitored, based on a position of radiation detected by the second photo detector.

6. A surface state monitoring apparatus according to claim 5, wherein
   the first radiation source and/or the second radiation source applies the first radiation and/or the second radiation to a region containing a position for the infrared radiation to be incident on the substrate-to-be-monitored.

7. A surface state monitoring apparatus according to claim 5, wherein
   the first radiation source and/or the second radiation source traverses the first radiation and/or the second radiation around a position for the infrared radiation to be incident on the substrate-to-be-monitored.

8. A surface state monitoring apparatus according to claim 4, wherein
   the first radiation source applies the first radiation to a region containing a position for the infrared radiation to be incident on the substrate-to-be-monitored.

9. A surface state monitoring apparatus according to claim 4, wherein
the first radiation source traverses the first radiation around a position for the infrared radiation to be incident on the substrate-to-be-monitored.

10. A surface state monitoring apparatus according to claim 4, wherein
the first radiation is radiation having a wavelength different from the wavelengths of the infrared radiation.

11. A surface state monitoring apparatus according to claim 4, wherein
the first photo detector one-dimensionally or two-dimensionally detects a position of the substrate-to-be-monitored.

12. A surface state monitoring apparatus according to claim 1, wherein
the position detecting means includes a second radiation source for applying second radiation to the peripheral edge of the substrate-to-be-monitored and a second photo detector for detecting the second radiation reflected by the peripheral edge; and
the position detecting means detects a vertical position of the substrate-to-be-monitored, based on a position of radiation detected by the second photo detector.

13. A surface state monitoring apparatus according to claim 12, wherein
the second radiation source applies the second radiation to a region containing a position for the infrared radiation to be incident on the substrate-to-be-monitored.

14. A surface state monitoring apparatus according to claim 12, wherein
the second radiation source traverses the second radiation around a position for the infrared radiation to be incident on the substrate-to-be-monitored.

15. A surface state monitoring apparatus according to claim 12, wherein
the second radiation is radiation having a wavelength different from the wavelengths of the infrared radiation.

16. A surface state monitoring apparatus according to claim 12, wherein
the second photo detector one-dimensionally or two-dimensionally detects a position of the substrate-to-be-monitored.

17. A surface state monitoring apparatus according to claim 1, wherein
the position detecting means optically detects a position of the substrate-to-be-monitored at a plurality of positions along the peripheral edge of the substrate-to-be-monitored.

18. A surface state monitoring method for monitoring a surface state of a substrate-to-be-monitored by introducing infrared radiation into the substrate-to-be-monitored via a declined face of a peripheral edge of the substrate-to-be-monitored, detecting infrared radiation which has undergone multiple reflections inside the substrate-to-be-monitored and exited from the substrate-to-be-monitored, and analyzing the detected infrared radiation,
a position of the substrate-to-be-monitored being optically detected in consideration of a configuration of the declined face of the peripheral edge of the substrate-to-be-monitored, and a position and an angle at which infrared radiation is incident on the substrate-to-be-monitored being controlled corresponding to the detected position of the substrate-to-be-monitored.

19. A surface state monitoring method according to claim 18, wherein
when the monitoring is repeated a plurality of times with the substrate-to-be-monitored rotated to monitor a surface of the substrate-to-be-monitored substantially all over the surface, prior to the monitoring for each time, a position of the substrate-to-be-monitored is optically detected, and a position and an angle of infrared radiation to be incident on the substrate-to-be-monitored are controlled corresponding to the detected position of the substrate-to-be-monitored.

* * * * *

UNITED STATES PATENT AND TRADEMARK OFFICE
CERTIFICATE OF CORRECTION

PATENT NO.    : 6,545,279 B1
DATED         : April 8, 2003
INVENTOR(S)   : Yoshida et al.

It is certified that error appears in the above-identified patent and that said Letters Patent is hereby corrected as shown below:

<u>Title page,</u>
Item [73], should read as -- [73] Assignee: Advantest Corp., Tokyo (JP) --

Signed and Sealed this

Nineteenth Day of August, 2003

JAMES E. ROGAN
*Director of the United States Patent and Trademark Office*